(12) United States Patent
Wang et al.

(10) Patent No.: US 10,283,483 B2
(45) Date of Patent: May 7, 2019

(54) PACKAGING METHOD AND PACKAGE STRUCTURE FOR IMAGE SENSING CHIP

(71) Applicant: China Wafer Level CSP Co., Ltd., Suzhou, Jiangsu (CN)

(72) Inventors: Zhiqi Wang, Suzhou (CN); Zhuowei Wang, Jiangsu (CN); Guoliang Xie, Jiangsu (CN)

(73) Assignee: China Wafer Level CSP Co., Ltd., Suzhou, Jiangsu (CN)

(*) Notice: Subject to any disclaimer, the term of this patent is extended or adjusted under 35 U.S.C. 154(b) by 0 days.

(21) Appl. No.: 15/765,802

(22) PCT Filed: Sep. 29, 2016

(86) PCT No.: PCT/CN2016/100817
§ 371 (c)(1),
(2) Date: Apr. 4, 2018

(87) PCT Pub. No.: WO2017/059781
PCT Pub. Date: Apr. 13, 2017

(65) Prior Publication Data
US 2018/0301434 A1    Oct. 18, 2018

(30) Foreign Application Priority Data

Oct. 10, 2015  (CN) .......................... 2015 1 0650103
Oct. 10, 2015  (CN) ..................... 2015 2 0780135 U (51) Int. Cl.
| H01L 23/00 | (2006.01) |
| H01L 23/488 | (2006.01) |
| H01L 27/146 | (2006.01) |

(52) U.S. Cl.
CPC ............ *H01L 24/94* (2013.01); *H01L 23/488* (2013.01); *H01L 27/1462* (2013.01);
(Continued)

(58) Field of Classification Search
None
See application file for complete search history.

(56) References Cited

U.S. PATENT DOCUMENTS

2009/0256260 A1   10/2009  Nakamura
2009/0284628 A1   11/2009  Wu et al.
(Continued)

FOREIGN PATENT DOCUMENTS

| CN | 101419952 A | 4/2009 |
| CN | 101800207 A | 8/2010 |

(Continued)

OTHER PUBLICATIONS

Brissette, P. "An Overview of LPI Soldermask and the PCB Manufacturing Process" available online at https://bayareacircuits.com/an-overview-of-lpi-soldermask-and-its-role-in-the-pcb-manufacturing-process/ on Jan. 16, 2015 (Year: 2015).*

(Continued)

*Primary Examiner* — Asok K Sarkar
*Assistant Examiner* — Grant S Withers
(74) *Attorney, Agent, or Firm* — Wolf, Greenfield & Sacks, P.C.

(57) ABSTRACT

A packaging method and package structure for an image sensing chip are provided. The method includes: providing a wafer including a first surface and a second surface opposite to the first surface, where the wafer has multiple image sensing chips arranged in a grid, each having an image sensing region and contact pads arranged on a side of the first surface of the wafer; forming openings extending towards the first surface on the second surface of the wafer, to expose the contact pads; forming V-shaped cutting trenches extending towards the first surface on the second surface of the wafer; and applying a photosensitive ink on the second surface of the wafer, to completely fill the (Continued)

V-shaped cutting trenches, cover the openings, and form a hollow cavity between each of the openings and the photosensitive ink.

15 Claims, 9 Drawing Sheets

(52) U.S. Cl.
CPC .... *H01L 27/1469* (2013.01); *H01L 27/14632* (2013.01); *H01L 27/14634* (2013.01); *H01L 27/14636* (2013.01); *H01L 27/14687* (2013.01); *H01L 27/14689* (2013.01); *H01L 2224/11* (2013.01)

(56) References Cited

U.S. PATENT DOCUMENTS

| | | | |
|---|---|---|---|
| 2010/0133640 A1 | 6/2010 | Wang et al. | |
| 2012/0205799 A1 | 8/2012 | Lin | |
| 2013/0026523 A1* | 1/2013 | Shiu | H01L 33/52 257/98 |
| 2015/0123285 A1* | 5/2015 | Lin | H01L 21/78 257/774 |
| 2015/0206916 A1* | 7/2015 | Lee | H01L 27/14632 257/433 |
| 2016/0190353 A1* | 6/2016 | Liao | H01L 27/14618 257/432 |
| 2017/0186712 A1* | 6/2017 | Shen | H01L 21/76898 |

FOREIGN PATENT DOCUMENTS

| | | |
|---|---|---|
| CN | 105244339 A | 1/2016 |
| CN | 205050828 U | 2/2016 |
| JP | 2009-206253 A | 9/2009 |
| JP | 2014-241446 A | 12/2014 |

OTHER PUBLICATIONS

"Liquid photoimageable Solder Masks" Article by Coates Circuit Products available online at https://www.coates.de/ccp/connections/liquid.pdf as of Nov. 2, 2013 (Year: 2013).*
English machine translation of JP 2014-241446 Sep. 2009 (Year: 2009).*
International Search Report for Application No. PCT/CN2016/100817 dated Jan. 4, 2016.
Office Action for Japanese Application No. 2018-517536, dated Mar. 5, 2019.

\* cited by examiner

PACKAGING METHOD AND PACKAGE STRUCTURE FOR IMAGE SENSING CHIP

This application is the national phase of International Patent Application No. PCT/CN2016/100817 filed on Sep. 29, 2016, which claims priority to Chinese Patent Application No. 201510650103.7, titled "PACKAGING METHOD AND PACKAGE STRUCTURE FOR IMAGE SENSING CHIP", and priority to Chinese Patent Application No. 201520780135.4, titled "IMAGE SENSING CHIP PACKAGE", both filed with the Chinese State Intellectual Property Office on Oct. 10, 2015, all of which applications are incorporated herein by reference in their entireties.

FIELD

The present disclosure relates to the technical field of semiconductors, and in particular to a packaging method for a wafer level semiconductor chip.

BACKGROUND

Currently, the wafer level chip size packaging (WLCSP) technology is the mainstream semiconductor chip packaging technology, in which a full wafer is packaged and tested, and then is cut to acquire individual finished chips. By using this packaging technology, the packaged individual finished chip almost has the same size as an individual crystalline grain, which meets the market requirement for lighter, smaller, shorter, thinner and cheaper microelectronic products. The wafer level chip size packaging technology is a hotspot in the current packaging field, and represents a development trend in the future.

Figure 1:
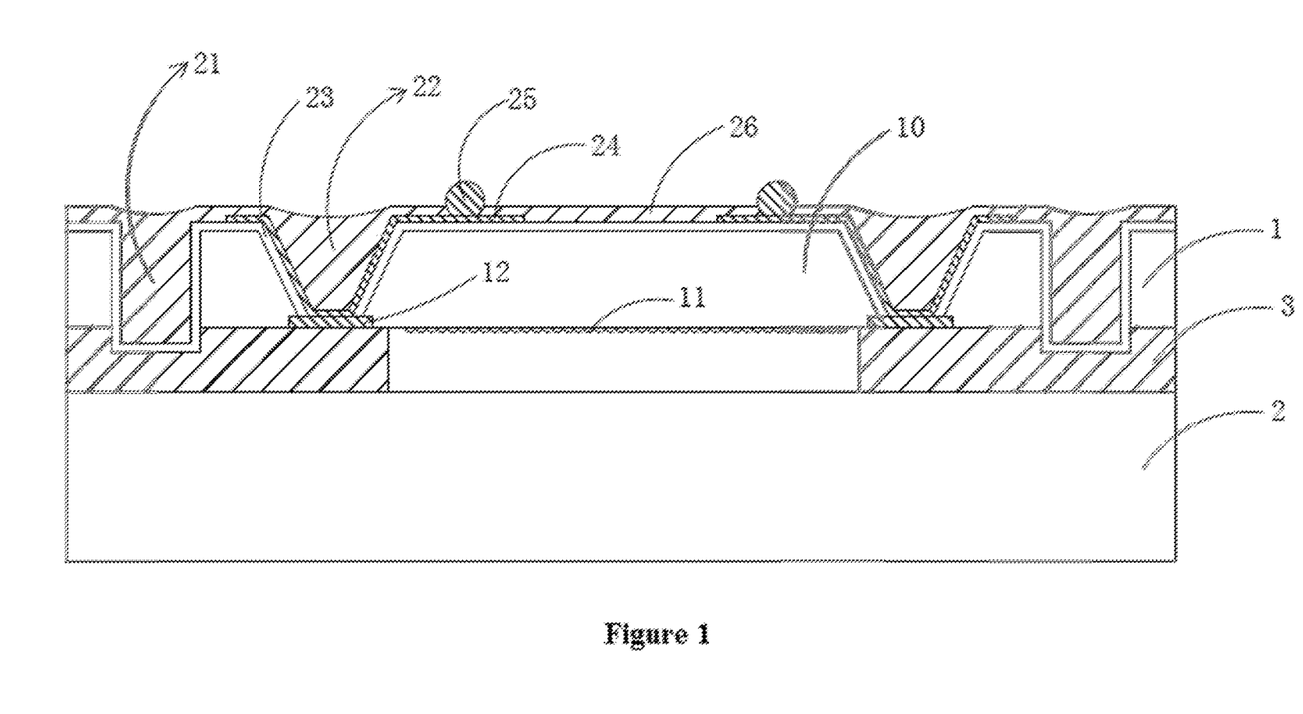
FIG. 1 is a schematic diagram of a wafer level image sensing chip package according to the conventional technology.

Reference is made to FIG. 1, which shows a wafer level image sensing chip package. A wafer 1 is aligned and laminated with a protective substrate 2. Support units 3 are between the wafer 1 and the protective substrate 2 to form a gap between the wafer 1 and the protective substrate 2, so as to prevent the protective substrate 2 from directly contacting with the wafer 1. The wafer 1 includes multiple image sensing chips 10 arranged in a grid. Each image sensing chip 10 includes an image sensing region 11 and contact pads 12. The multiple support units 3 are arranged in a grid on the protective substrate 2, and correspond to the image sensing chips 10. After the protective substrate 2 is aligned and laminated with the wafer 1, the support units 3 enclose the image sensing region 11. The wafer 1 has a first surface and a second surface opposite the first surface. The image sensing region 11 and the contact pads 12 are arranged on the side of the first surface of the wafer.

In order to realize electrical connection between the contact pad 12 and other circuits, an opening 22 extending towards the first surface is provided on the side of the second surface of the wafer 1. The opening 22 corresponds to the contact pad 12, and the contact pad 12 is exposed from the bottom of the opening 22. An insulating layer 23 is arranged on a sidewall of the opening 22. A rewiring layer 24 is arranged on the insulating layer 23 and at the bottom of the opening 22. The rewiring layer 24 is electrically connected to the contact pad 12. Solder balls 25 are electrically connected to the rewiring layer 24. The electrical connection between the contact pad 12 and other circuits is realized by electrically connecting the solder balls 25 to the other circuits.

The second surface of the wafer 1 is provided with a cutting trench 21 extending towards the first surface, in order to facilitate cutting off the packaged image sensing chip.

Before the solder ball 25 is arranged on the second surface of the wafer 1, solder mask ink 26 is required to be applied on the second surface. Normally the cutting trench 21 and the opening 22 are also filled with the solder mask ink 26 for the purpose of protection and insulation.

However, since the opening 22 is completely filled with the solder mask ink 26, a stress is generated by thermal expansion and contraction of the solder mask ink 26 in the subsequent reflow soldering and reliability testing. The stress is applied to the rewiring layer 24, and the rewiring layer 24 is easily detached from the contact pad 12 under the stress, resulting in a defective chip, which becomes the technical problem desired to be solved by those skilled in the art.

SUMMARY

An object of the present disclosure is to provide a wafer level image sensing chip packaging method and an image sensing chip package to prevent a rewiring layer from being detached from a solder pad, thereby solving the problem of defective chip, and improving the reliability of the image sensing chip package.

In order to solve the above problem, an image sensing chip packaging method is provided according to the present disclosure, which includes:

providing a wafer including a first surface and a second surface opposite to the first surface, where the wafer has multiple image sensing chips are arranged in a grid, each of the image sensing chips has an image sensing region and contact pads, and the image sensing region and the contact pads are arranged on a side of the first surface of the wafer;

forming openings extending towards the first surface on the second surface of the wafer, where the contact pads are exposed through the openings;

forming V-shaped cutting trenches extending towards the first surface on the second surface of the wafer; and applying a photosensitive ink on the second surface of the wafer, to completely fill the V-shaped cutting trenches with the photosensitive ink, cover the openings with the photosensitive ink, and form a hollow cavity between each of the openings and the photosensitive ink.

Preferably, the V-shaped cutting trenches and the openings may be formed on the second surface of the wafer in a same etching process.

Preferably, the V-shaped cutting trenches may be formed by cutting from the second surface of the wafer with a cutter.

Preferably, before forming the V-shaped cutting trenches and the openings on the second surface of the wafer, the image sensing chip packaging method may further include:

providing a protective substrate, where the protective substrate has support units arranged in a grid, and each of the support units corresponds to one of the image sensing chips;

aligning and laminating the first surface of the wafer with the protective substrate, with the support units being between the wafer and the protective substrate; and grinding and thinning the wafer on the second surface.

Preferably, after forming the V-shaped cutting trenches and before applying the photosensitive ink, a cutter may cut along the V-shaped cutting trenches, and the cutter may cut into at least a portion of the support unit.

Preferably, a cut width of the cutter may be less than an opening width of each of the V-shaped grooves close to the second surface of the wafer.

Preferably, the V-shaped cutting trenches are formed by cutting by a cutter from the second surface of the wafer, and the cutter at least cut into a portion of the support unit.

Preferably, before applying the photosensitive ink, the image sensing chip packaging method may further include:

forming an insulating layer on a sidewall of each of the openings and on the second surface of the wafer; and forming a rewiring layer on the insulating layer and at the bottom of the opening, where the rewiring layer is electrically connected to the contact pad; and after applying the photosensitive ink on the second surface of the wafer, the image sensing chip packaging method may further include:

forming multiple through holes on the photosensitive ink, where the rewiring layer is exposed through the through holes; and forming a solder ball in each of the through holes, where the solder ball is electrically connected to the rewiring layer.

Preferably, a viscosity of the photosensitive ink may be not less than 12 Kcps.

An image sensing chip package is further provided according to the present disclosure, which includes:

a substrate including a first surface and a second surface opposite to the first surface;

an image sensing region and contact pads, arranged on the first surface;

openings arranged on the second surface and extending towards the first surface, where the contact pads are exposed through the openings; and a photosensitive ink covering a sidewall of the substrate, where the photosensitive ink covers the openings, and a hollow cavity is formed between each of the openings and the photosensitive ink; and the sidewall of the substrate includes an inclined sidewall, where one end of the inclined sidewall is connected to the second surface.

Preferably, the sidewall of the substrate may further include a vertical sidewall, one end of the vertical sidewall may be connected to the inclined sidewall, and the other end of the vertical sidewall may be connected to the first surface.

Preferably, the other end of the inclined sidewall may be connected to the first surface of the substrate.

Preferably, an angle between the inclined sidewall and the second surface of the substrate may range from 40° to 85°.

Preferably, a viscosity of the photosensitive ink may be not less than 12 Kcps.

Preferably, the package may further include:

a protective substrate aligned and laminated with the first surface of the substrate;

a support unit arranged between the protective substrate and the substrate, and enclosing the image sensing region, where the photosensitive ink covers at least a portion of a sidewall of the support unit;

an insulating layer arranged on a sidewall of each of the openings and on the second surface of the substrate;

a rewiring layer arranged on the insulating layer and at the bottom of the opening, where the rewiring layer is electrically connected to the contact pad, and the photosensitive ink covers the rewiring layer and is provided with through holes through which the rewiring layer is exposed; and a solder ball arranged in each of the through holes, where the solder ball is electrically connected to the rewiring layer.

An advantageous effect of the present disclosure is that the hollow cavity is formed between the opening and the photosensitive ink, so that the rewiring layer is effectively prevented from being detached from the contact pad, thereby improving the image sensing chip package yield, and improving the reliability of a package for the image sensing chip.

DETAILED DESCRIPTION OF EMBODIMENTS

Specific embodiments of the present disclosure are described below in detail in conjunction with the drawings. The embodiments are not intended to limit the present disclosure, and any modification in structures, methods or functions made by those skilled in the art according to these embodiments fall within the protection scope of the present disclosure.

In the conventional technology, the opening is filled with a solder mask ink, such that the solder mask ink completely contacts with the rewiring layer. In the subsequent reflow soldering and reliability testing, a stress generated by the expansion and contraction of the solder mask ink is applied to the rewiring layer, which results in the rewiring layer being easily detached from the contact pad 12.

In order to solve the above problem, according to the present disclosure, a hollow cavity is formed between the opening and the solder mask ink, so that the solder mask ink does not contact with the wiring layer at the bottom of the opening, thereby effectively preventing the rewiring layer from being detached from the contact pad.

Figure 2:
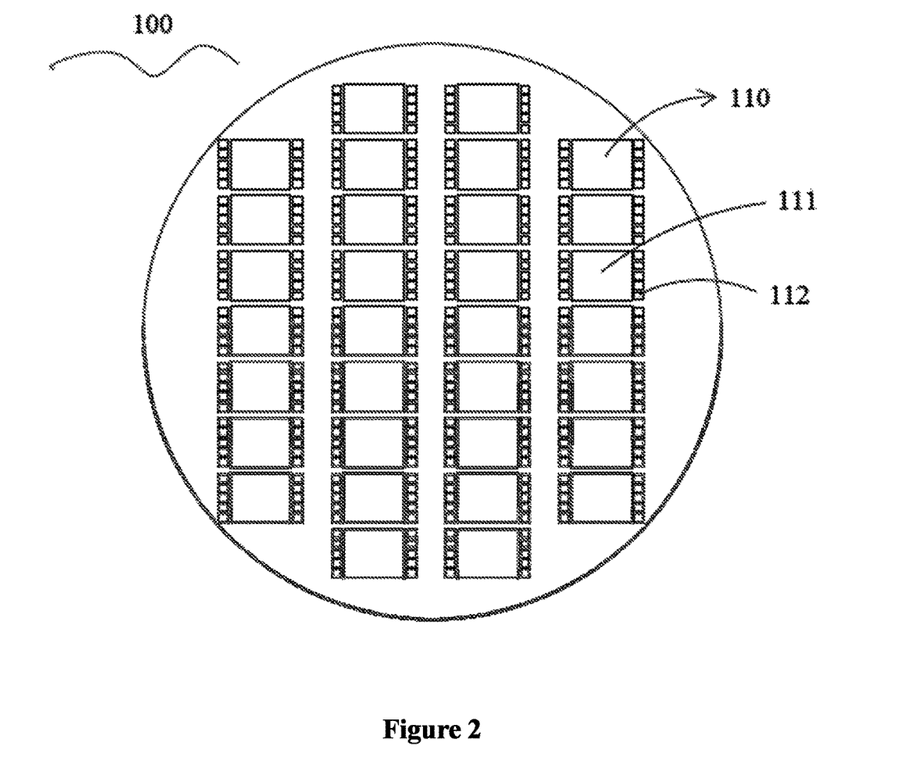
FIG. 2 is a schematic diagram showing a structure of a wafer level image sensing chip.

Reference is made to FIG. 2, which is a schematic diagram showing a structure of a wafer level image sensing chip. A wafer 100 has multiple image sensing chips 110 arranged in a gird. Gaps are reserved between the image sensing chips 110. After the packaging process and the testing are completed, the image sensing chips are separated along the gaps.

Each image sensing chip 110 has an image sensing region 111 and multiple contact pads 112 arranged at periphery of the image sensing region 111. The contact pad 112 and the image sensing region 111 are arranged on a side of the same surface of the wafer 100.

Figure 3:
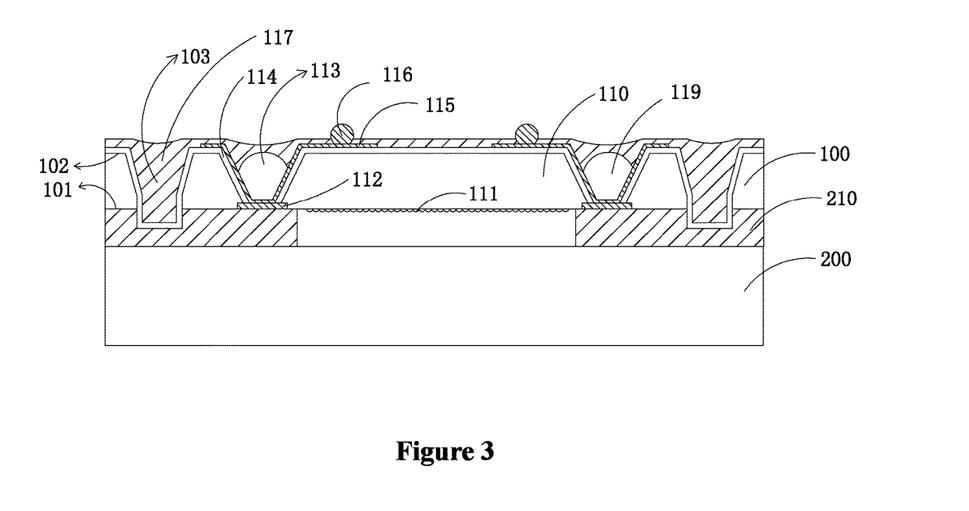
FIG. 3 is a schematic cross-sectional view of a wafer level image sensing chip package.

Reference is made to FIG. 3, which is a schematic cross-sectional view of a wafer level image sensing chip package according to an embodiment of the present disclosure. Multiple support units 210 are arranged in a grid on one side of a protective substrate 200. After the wafer 100 is aligned and laminated with the protective substrate 200, the support units 210 are between the wafer 100 and the protective substrate 200 to form a gap between the wafer 100 and the protective substrate 200. The support units 210 correspond to the image sensing chips 110 in a one-to-one correspondence, and the support units 210 enclose the image sensing regions 111.

The wafer 100 has a first surface 101 and a second surface 102 opposite to the first surface 101. The image sensing region 111 and the contact pads 112 are arranged on the side of the first surface 101. The second surface 102 of the wafer is provided with V-shaped cutting trenches 103 and openings 113 extending towards the first surface 101. Each opening 113 corresponds to one contact pad 112 in terms of position, and the contact pad 112 is exposed from the bottom of the opening 113.

A rewiring layer 115 and solder balls 116 are used to facilitate connection between the contact pads 112 and other circuits. In an embodiment, an insulating layer 114 is formed on a sidewall of the opening 113 and on the second surface 102 of the wafer 100. The rewiring layer 115 is formed on the insulating layer 114 and at the bottom of the opening 113. The rewiring layer 115 is electrically connected to the contact pad 112. The solder ball 116 is arranged on the second surface 102 of the wafer 100. The solder ball 116 is electrically connected to the rewiring layer 115. The electrical connection between the contact pad 112 and other circuits is realized by electrically connecting the solder ball 116 to the other circuit.

The V-shaped cutting trench 103 is completely filled with a photosensitive ink 117. The photosensitive ink 117 covers the opening 113, and a hollow cavity 119 is formed between the opening 113 and the photosensitive ink 117. The photosensitive ink 117 has through holes through which the rewiring layer 115 is exposed. The solder balls 116 are arranged in the through holes and electrically connected to the rewiring layer 115.

Correspondingly, a specific packaging process for completely filling the V-shaped cutting trench 103 with the photosensitive ink 117 and forming the hollow cavity 119 between the opening 113 and the photosensitive ink 117 is described as follows.

The wafer 100 is provided, referring to FIG. 1 for the structural diagram of the wafer 100.

The protective substrate 200 is provided, and the multiple support units 210 are arranged in a grid on one side of the protective substrate 200. In this embodiment, the support units 210 are made of photosensitive ink and formed on one side of the protective substrate 200 by an exposing and developing process.

Figure 4:
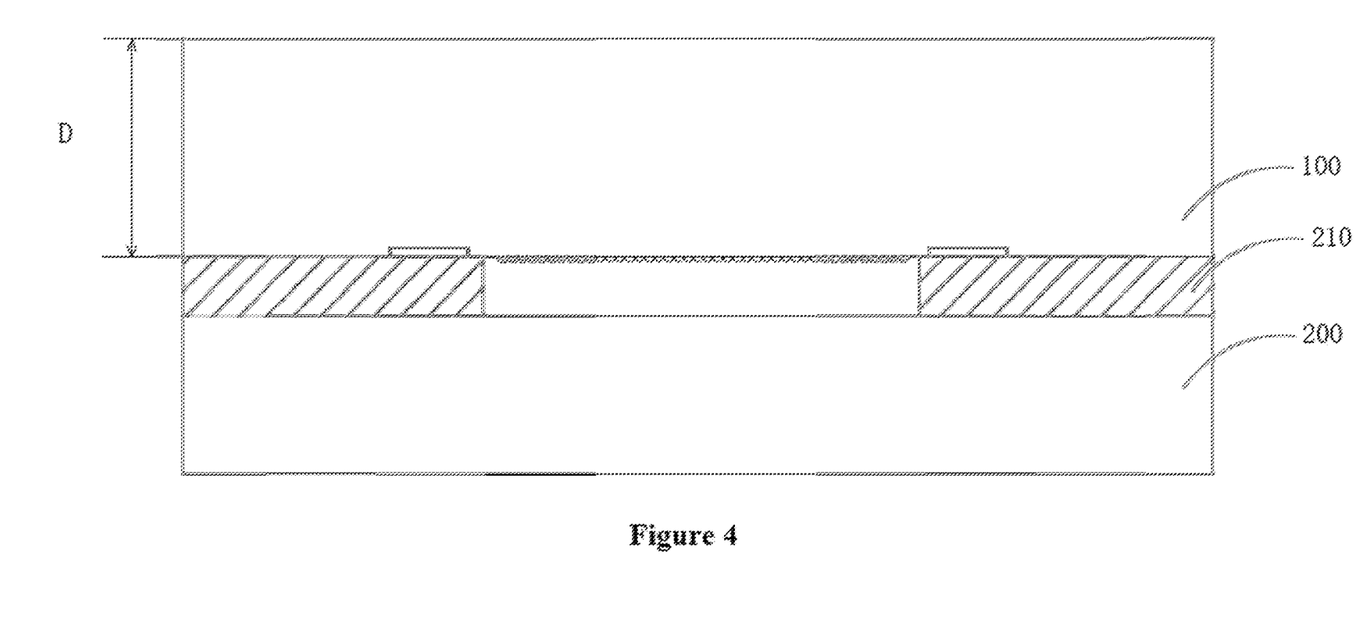
FIGS. 4 to 11 are schematic diagrams illustrating a wafer level image sensing chip packaging method according to the present disclosure.

Referring to FIG. 4, the wafer 100 is aligned and laminated with the protective substrate 200, and the wafer 100 is bonded to the protective substrate 200 with an adhesive. The support unit 210 is between the wafer 100 and the protective substrate 200. Multiple sealed spaces are formed in a grid by the enclosure of the support unit 210, the wafer 100 and the protective substrate 200. Each of the sealed spaces corresponds to one image sensing chip 110. The support unit 210 encloses the image sensing region 111 of the image sensing chip 110.

Figure 5:
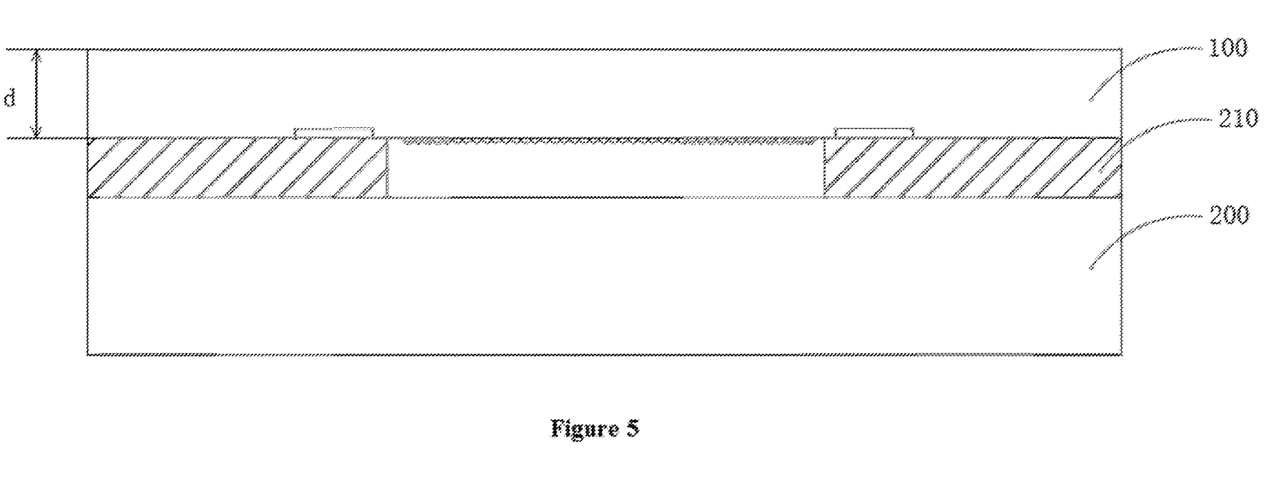

Referring to FIG. 5, the wafer 100 is grinded and thinned on the second surface 102. A thickness of the wafer 100 before thinning is denoted as D, and a thickness of the wafer 100 after thinning is denoted as d.

Figure 6:
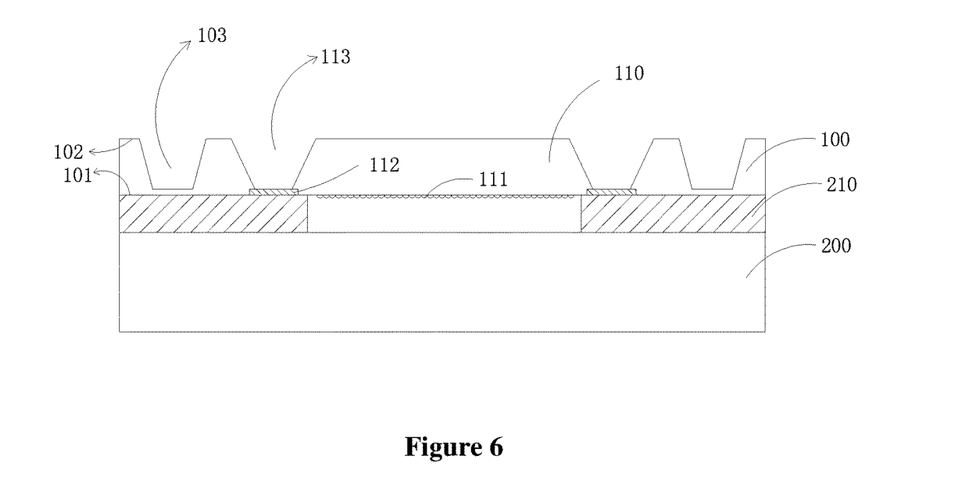

Referring to FIG. 6, V-shaped cutting trenches 103 and the openings 113 extending towards the first surface 101 of the wafer 100 are etched on the second surface 102 of the wafer 100 in a same etching process. The contact pad 112 is exposed from the bottom of the opening 113. In this embodiment, a depth of the V-shaped cutting trench 103 is the same as a depth of the opening 113. Apparently, this step may include etching only the opening 113 without the V-shaped cutting trench 103.

Figure 7A:
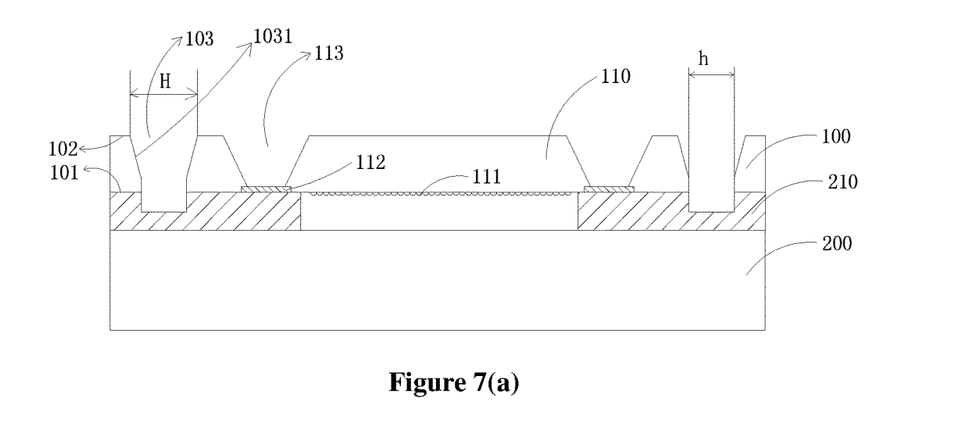

Referring to FIG. 7(a), a cutter is used to cut from the second surface 102 of the wafer 100 towards the first surface 101 along the V-shaped cutting trench 103 until the first surface 101 of the wafer 100 is cut through, that is, the cutter cuts into a portion of the support unit 210. Since the material of the wafer 100 is brittle and has poor toughness and ductility, the cutter is selected to have a high hardness, such as a metal knife. In addition, a cut width h of the cutter is less than a width H of an opening of the V-shaped cutting trench 103 close to the second surface 102, so that a portion of an inclined sidewall 1031 is reserved for the V-shaped cutting trench 103. The inclined sidewall 1031 has a function of guiding the flow of the photosensitive ink 117 that is to be applied in the subsequent process, so that the photosensitive ink 117 more easily fills up the V-shaped cutting trench 103.

Figure 7B:
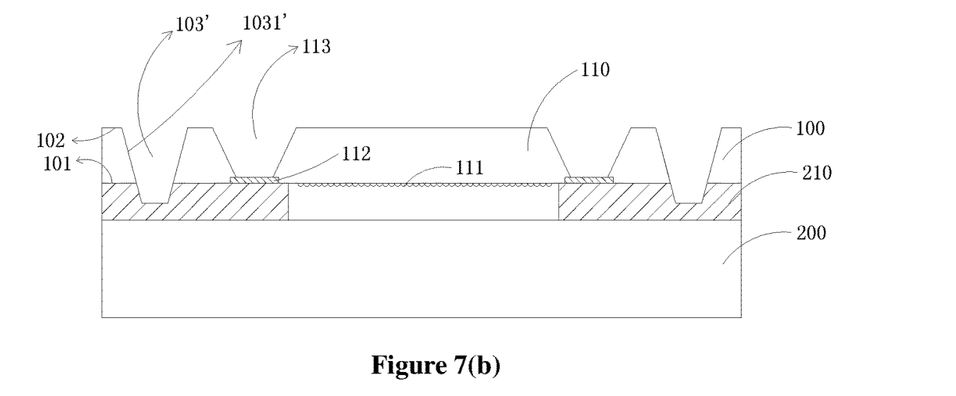

Referring to FIG. 7(b), in another embodiment of the present disclosure, a cutter may be used to cut from the second surface 102 of the wafer 100 along the gap to directly form a V-shaped cutting trench 103', and the cutter cuts through the first surface 101 of the wafer 100, that is, the cutter cuts into a portion of the support unit 210. In this way, the V-shaped groove 103' having an inclined sidewall 1031' is directly formed by cutting with the cutter. The inclined sidewall 1031' has a function of guiding the flow of the photosensitive ink 117 that is to be applied in the subsequent process, so that the photosensitive ink 117 more easily fills up the V-shaped cutting trench 103'.

Figure 8A:
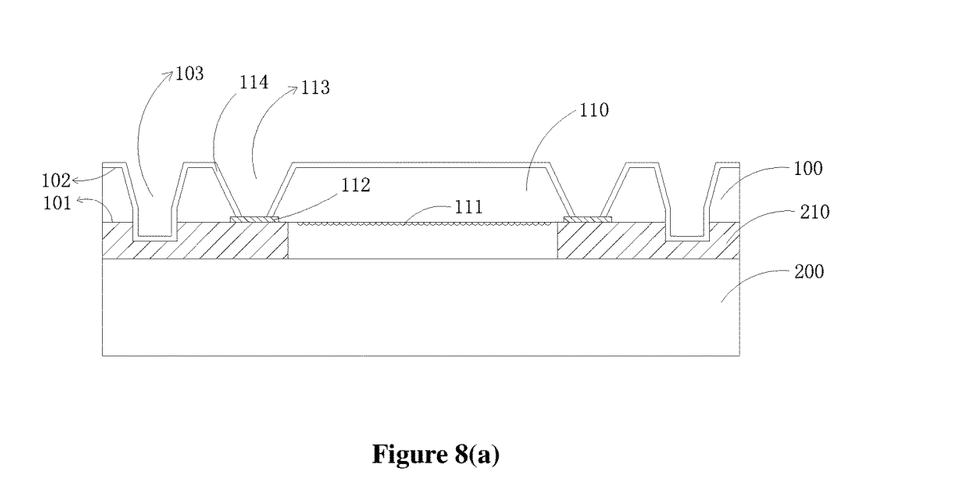

Referring to FIG. 8(a), the insulating layer 114 is formed on the second surface 102 of the wafer 100, on a sidewall of the opening 113, at the bottom of the opening 113, and on an inner wall of the V-shaped cutting trench 103. In this embodiment, the insulating layer 114 is made of an organic insulating material, thereby having insulativity and flexibility. The insulating layer 114 is formed by a spraying or spin-coating process, and then the contact pad 112 is exposed by means of laser or by an exposing and developing process.

Figure 8B:
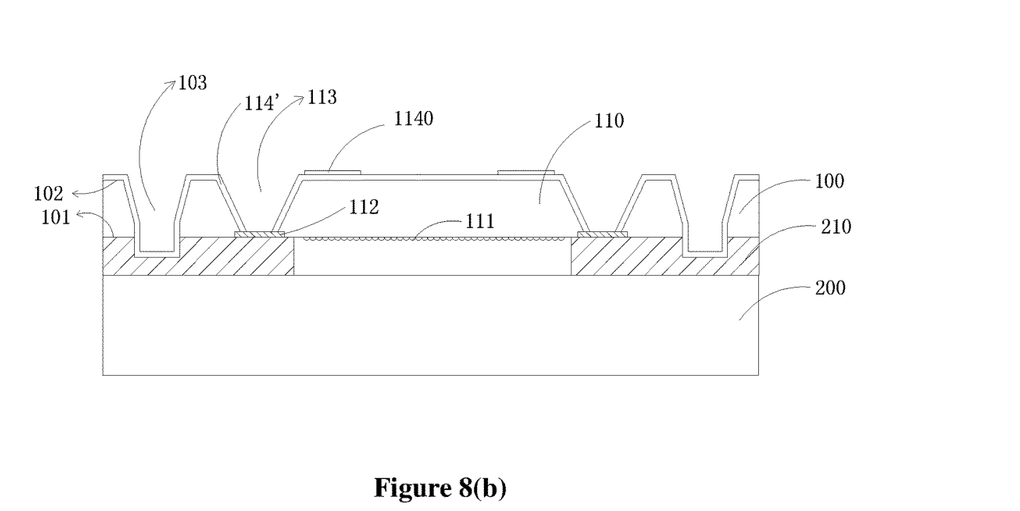

Referring to FIG. 8 (b), in another embodiment of the present disclosure, an insulating layer 114' may be deposited on the second surface 102 of the wafer 100, on the sidewall of the opening 113, at the bottom of the opening 113, and on the inner wall of the V-shaped cutting trench 103. The insulating layer 114' is made of an inorganic material, which normally is silicon dioxide. Since impact resistance of the silicon dioxide is not as good as that of the organic insulating material 114, a buffer layer 1140 is formed on the second surface of the wafer 101 by an exposing and developing process to facilitate subsequent solder ball bonding. Then the insulating layer at the bottom of the opening 113 is etched off by an etching process to expose the contact pad 112.

Figure 9:
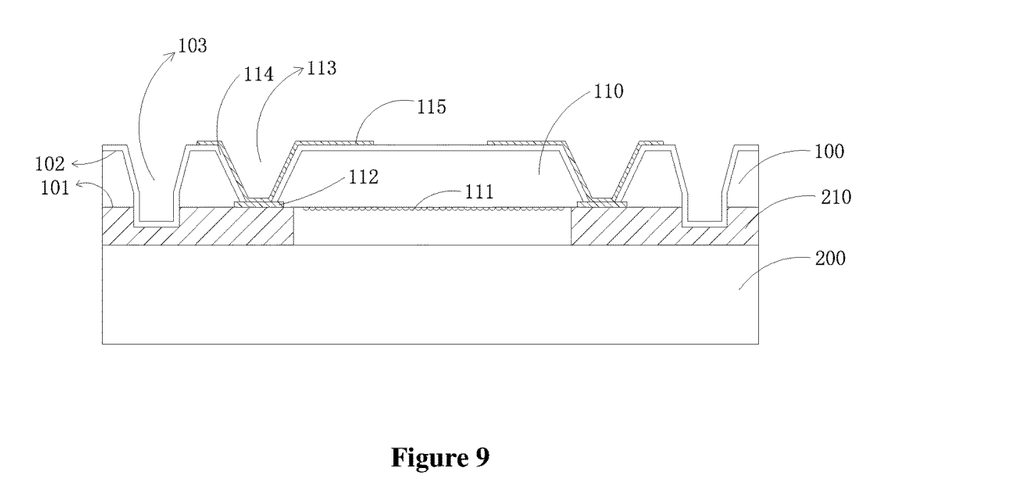

Referring to FIG. 9, the rewiring layer 115 is formed on the insulating layer 114 (or the insulating layer 114'), and the rewiring layer 115 is electrically connected to the contact pad 112.

The key of the present disclosure is to complete fill the V-shaped cutting trench 103 with the photosensitive ink, but form the hollow cavity 119 between the opening 113 and the photosensitive ink so that the photosensitive ink does not contact the bottom of the opening 113 to prevent the opening 113 from being completely filled with the photosensitive ink.

According to the present disclosure, it is required to reduce a viscosity of the photosensitive ink to make the photosensitive ink easily fill up the cutting trench, while increase the viscosity of the photosensitive ink to make the photosensitive ink difficultly fill the lower portion of the opening, which is a conflict point to be solved in the present disclosure.

According to the present disclosure, the cutting trench is designed as a cutting trench with an inclined sidewall, in order to guide a photosensitive ink with a high viscosity to flow into the lower portion of the cutting trench. Therefore, the photosensitive ink completely fills only the cutting trench, but cannot complete fill the opening so as to form a hollow cavity between the opening and the photosensitive ink. In this way, the conflict point can be well solved.

Figure 10:
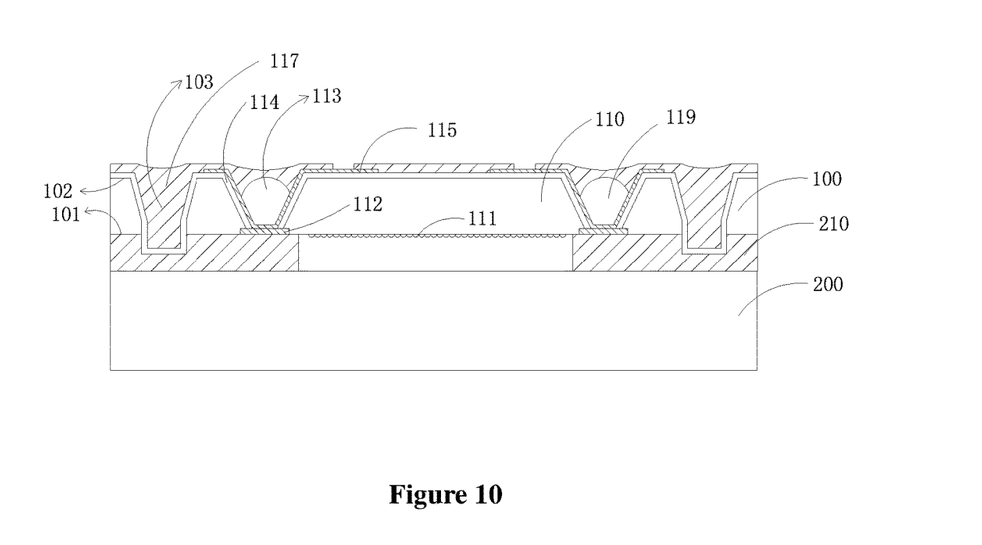

Referring to FIG. 10, the photosensitive ink 117 is applied on the second surface 102 of the wafer 100, so that the photosensitive ink 117 completely fills the V-shaped cutting trench 103 and covers the opening 113, and forms the hollow cavity 119 between the opening 113 and the photosensitive ink 117.

In the present disclosure, a photosensitive ink with a viscosity not less than 12 Kcps is preferably used.

In this embodiment, the photosensitive ink 117 is applied on the second surface 102 of the wafer 100 by a spin-coating process. A spin-coating rate may be adjusted based on the viscosity of the photosensitive ink, so that the photosensitive ink 117 completely fills the V-shaped cutting trench 103 and covers the opening 113, and forms the hollow cavity 119 between the opening 113 and the photosensitive ink 117.

A solder mask is formed by the photosensitive ink 117, to provide a solder resist function so as to protect the chip in the subsequent solder ball bonding process.

In order to facilitate the subsequent solder ball bonding, a through hole is formed on the photosensitive ink 117 at a position corresponding to the rewiring layer 115. Specifically, the through hole exposing the rewiring layer 115 may be formed by a curing process and an exposing and developing process after the photosensitive ink 117 is applied on the entire second surface 102 of the wafer 100. Apparently, the through hole exposing the rewiring layer 115 may be formed by applying the photosensitive ink 117 on the second surface 102 of the wafer 100 by a screen-printing process.

Figure 11:
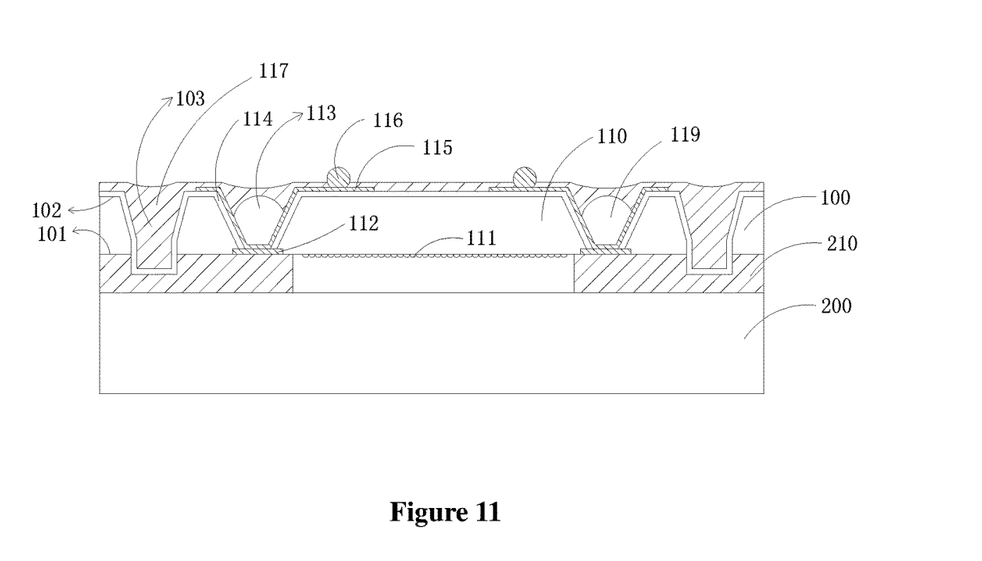

Referring to FIG. 11, the solder ball 116 is formed in the through hole by a solder ball bonding process, so that the solder ball 116 is electrically connected to the rewiring layer 115.

Finally, the wafer 100 and the protective substrate 200 are cut from the second surface 102 of the wafer 100 towards the first surface 101 of the wafer 100 along the V-shaped cutting trench 103 to acquire individual image sensing chip packages.

Figure 12:
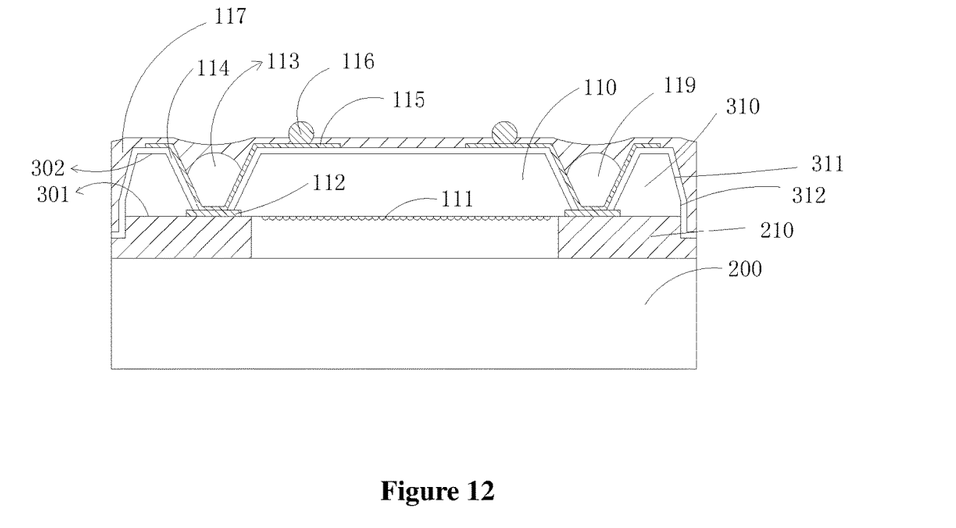
FIG. 12 is a schematic diagram of an individual image sensing chip package according to an embodiment of the present disclosure.

Referring to FIG. 12, an individual image sensing chip package 300 includes a substrate 310 cut from the wafer 100. The substrate 310 has a first surface 301 and a second surface 302 opposite to the first surface 301. The image sensing region 111 and the contact pad 112 are arranged on the first surface 301. The opening 113 and the solder ball 116 are arranged on the second surface 302. A sidewall of the substrate 310 is covered by the photosensitive ink 117.

In this embodiment, the sidewall of the substrate 310 includes an inclined sidewall 311 and a vertical sidewall 312. One end of the inclined sidewall 311 is connected to the second surface 302, the other end of the inclined sidewall 311 is connected to the vertical sidewall 312, and the other end of the vertical sidewall 312 is connected to the first surface 301.

Figure 13:
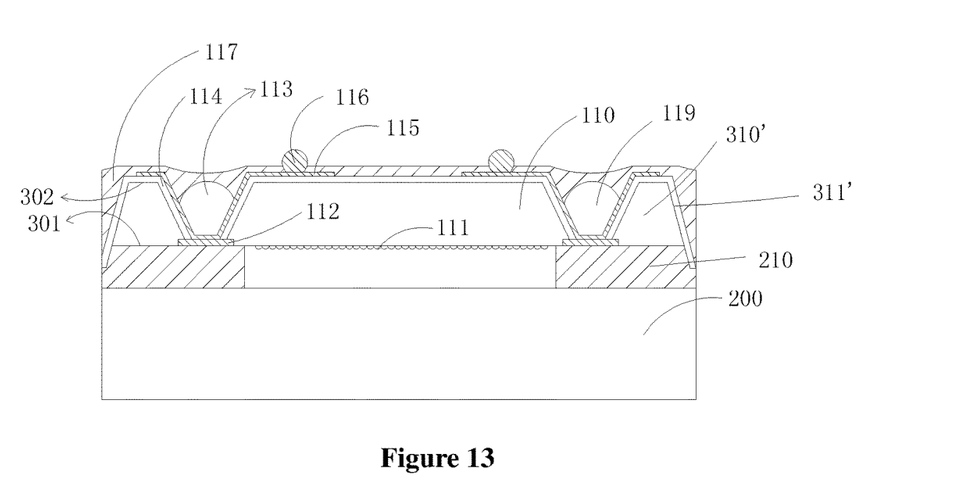
FIG. 13 is a schematic diagram of an individual image sensing chip package according to another embodiment of the present disclosure.

In another embodiment, referring to FIG. 13, a substrate 310' has an inclined sidewall 311'. One end of the inclined sidewall 311' is connected to the second surface 302, and the other end of the inclined sidewall 311' is connected to the first surface 301.

Preferably, an angle between the inclined sidewall 311 (or the inclined sidewall 311') and the second surface 302 of the substrate 310 ranges from 40° to 85°.

The sidewall of the substrate 310 and a portion of the sidewall of the support unit 210 are covered by the photosensitive ink 117.

In a case where the insulating layer 114 is made of an organic insulating material, the buffer layer 1140 may not be arranged between the rewiring layer 115 and the insulating layer 114 at a position corresponding to the solder ball 116.

In a case where the insulating layer 114' is made of an inorganic material, the buffer layer 1140 is arranged between the rewiring layer 115 and the insulating layer 114' at the position corresponding to the solder ball 116. The buffer layer 1140 is made of a photoresist material and may be formed by an exposing and developing process.

It should be understood that, the description of the embodiments is made in the present specification, but each embodiment does not merely include one independent technical solution. The description manner of the specification is only for clarity. Those skilled in the art should take the specification as a whole, in which technical solutions in the embodiments may be combined appropriately to form other embodiments understandable for those skilled in the art.

The detailed description above is only for illustrating feasible embodiments of the present disclosure and is not intended to limit the protection scope of the present disclosure. Any equivalent implementations or changes made without departing from the technology and spirit of the present disclosure should be included in the protection scope of the present disclosure.

The invention claimed is:

1. An image sensing chip packaging method, comprising:
providing a wafer comprising a first surface and a second surface opposite to the first surface, wherein the wafer has a plurality of image sensing chips arranged in a grid, each of the image sensing chips has an image sensing region and contact pads, and the image sensing region and the contact pads are arranged on a side of the first surface of the wafer;
forming openings extending towards the first surface on the second surface of the wafer, wherein the contact pads are exposed through the openings;
forming V-shaped cutting trenches extending towards the first surface on the second surface of the wafer; and
applying a photosensitive ink on the second surface of the wafer, to completely fill the V-shaped cutting trenches with the photosensitive ink, cover the openings with the photosensitive ink, and form a hollow cavity between each of the openings and the photosensitive ink.

2. The image sensing chip packaging method according to claim 1, wherein the V-shaped cutting trenches and the openings are formed on the second surface of the wafer in a same etching process.

3. The image sensing chip packaging method according to claim 1, wherein the V-shaped cutting trenches are formed by cutting from the second surface of the wafer with a cutter.

4. The image sensing chip packaging method according to claim 1, wherein before forming the V-shaped cutting trenches and the openings on the second surface of the wafer, the image sensing chip packaging method further comprises:
providing a protective substrate, wherein the protective substrate has support units arranged in a grid, and each of the support units corresponds to one of the image sensing chips;

aligning and laminating the first surface of the wafer with the protective substrate, with the support units being between the wafer and the protective substrate; and grinding and thinning the wafer on the second surface.

5. The image sensing chip packaging method according to claim 4, wherein after forming the V-shaped cutting trenches and before applying the photosensitive ink, the image sensing chip packaging method further comprises:

cutting, by a cutter, along the V-shaped cutting trenches, into at least a portion of the support unit.

6. The image sensing chip packaging method according to claim 5, wherein a cut width of the cutter is less than an opening width of each of the V-shaped grooves close to the second surface of the wafer.

7. The image sensing chip packaging method according to claim 4, wherein the V-shaped cutting trenches are formed by cutting by a cutter from the second surface of the wafer, and the cutter at least cuts into a portion of the support unit.

8. The image sensing chip packaging method according to claim 1, wherein before applying the photosensitive ink, the image sensing chip packaging method further comprises:

forming an insulating layer on a sidewall of each of the openings and on the second surface of the wafer; and forming a rewiring layer on the insulating layer and at the bottom of the opening, wherein the rewiring layer is electrically connected to the contact pad; and wherein after applying the photosensitive ink on the second surface of the wafer, the image sensing chip packaging method further comprises:

forming a plurality of through holes on the photosensitive ink, wherein the rewiring layer is exposed through the through holes; and forming a solder ball in each of the through holes, wherein the solder ball is electrically connected to the rewiring layer.

9. The image sensing chip packaging method according to claim 1, wherein a viscosity of the photosensitive ink is not less than 12Kcps.

10. An image sensing chip package, comprising:

a substrate comprising a first surface and a second surface opposite to the first surface;

an image sensing region and contact pads, arranged on the first surface;

openings arranged on the second surface and extending towards the first surface, wherein the contact pads are exposed through the openings; and a photosensitive ink covering a sidewall of the substrate, wherein the photosensitive ink covers the openings, and a hollow cavity is formed between each of the openings and the photosensitive ink; and the sidewall of the substrate comprises an inclined sidewall, wherein one end of the inclined sidewall is connected to the second surface;

wherein the sidewall of the substrate is distinct from the openings.

11. The image sensing chip package according to claim 10, wherein the sidewall of the substrate further comprises a vertical sidewall, one end of the vertical sidewall is connected to the inclined sidewall, and the other end of the vertical sidewall is connected to the first surface.

12. The image sensing chip package according to claim 10, wherein the other end of the inclined sidewall is connected to the first surface of the substrate.

13. The image sensing chip package according to claim 10, wherein an angle between the inclined sidewall and the second surface of the substrate ranges from 40° to 85°.

14. The image sensing chip package according to claim 10, wherein a viscosity of the photosensitive ink is not less than 12Kcps.

15. The image sensing chip package according to claim 10, further comprising:

a protective substrate aligned and laminated with the first surface of the substrate;

a support unit arranged between the protective substrate and the substrate, and enclosing the image sensing region, wherein the photosensitive ink covers at least a portion of a sidewall of the support unit;

an insulating layer arranged on a sidewall of each of the openings and on the second surface of the substrate;

a rewiring layer arranged on the insulating layer and at the bottom of the opening, wherein the rewiring layer is electrically connected to the contact pad, and the photosensitive ink covers the rewiring layer and is provided with through holes through which the rewiring layer is exposed; and a solder ball arranged in each of the through holes, wherein the solder ball is electrically connected to the rewiring layer.

* * * * *